United States Patent [19]

Tambe et al.

[11] Patent Number: 4,996,474
[45] Date of Patent: Feb. 26, 1991

[54] DIGITAL GATE GENERATION FOR A SIGNAL MEASUREMENT INSTRUMENT

[75] Inventors: Atul Tambe, San Jose; David Chu, Woodside; Lee D. Cosart, III, Palo Alto, all of Calif.

[73] Assignee: Hewlett-Packard Company, Pal Alto, Calif.

[21] Appl. No.: 388,214

[22] Filed: Jul. 31, 1989

[51] Int. Cl.⁵ ............................................. G01R 23/02
[52] U.S. Cl. ............................... 324/78 D; 324/79 D; 377/20; 328/129.1; 364/484
[58] Field of Search ............ 377/20; 328/129.1, 130.1; 324/78 D, 78 R, 79 D

[56] References Cited

U.S. PATENT DOCUMENTS

| | | | |
|---|---|---|---|
| 4,420,809 | 12/1983 | Pierce | 324/78 D |
| 4,678,345 | 7/1987 | Agoston | 377/20 |
| 4,680,540 | 7/1987 | Niki et al. | 324/78 D |
| 4,685,078 | 8/1987 | Morita et al. | 377/20 |
| 4,786,861 | 11/1988 | Hulsing et al. | 324/78 D |

*Primary Examiner*—John S. Heyman
*Attorney, Agent, or Firm*—James M. Williams

[57] ABSTRACT

A method of digitally controlling the gate for a timing counter, to open and close the gate based on the occurrence of signal events, rather than on the envelope of the pulse. In a particular embodiment, a digital divider controls the gate, so that, when a pulse burst of RF is encountered, the gate opens on the second signal event. The divider can be programmed to close the gate any number of signal events later. Measurements are taken for an integral number of signal events, while counting time events from a precision clock. A series of measurements can be taken with various integral numbers of signal events for frequency profiling. By incrementing the digital divider from n to n+1 signal events for successive measurements, and subtracting the results, very narrow gates are effectively generated which move through the pulse cycle by cycle for frequency profiling. Because the opening of the gate is triggered by the IF events themselves, the gate is reliably and accurately positioned with respect to the pulse, and is unaffected by jitter in the pulse repetition interval.

10 Claims, 7 Drawing Sheets

DIGITAL GATE GENERATION FOR A SIGNAL MEASUREMENT INSTRUMENT

FIELD OF THE INVENTION

The invention relates to instruments which utilize a measurement gate to control the interval during which a measurement is taken on an electrical signal and more particularly to a method and apparatus for generating gates for signal measurement instruments, for example frequency and time interval counters.

BACKGROUND OF THE INVENTION

Precision time interval measurements using an electronic counter allow accurate measurement of the elapsed time between start and stop events. Typically, instruments include two counters, a time counter to accumulate events from a stable clock, and an event counter to accumulate events from an input signal. Dividing the number of events in the event counter by the result in the time counter provides the average frequency of the input signal. The two counters are started and stopped by a signal called a gate. If the gate is synchronized with the clock, the gate time is controlled exactly and the number of input signal events is counted with some uncertainty (plus or minus one event). If the gate is synchronized with the input signal, the number of input signal events is counted exactly and the elapsed time is counted with some uncertainty (plus or minus one clock period). Increased accuracy can be gained by averaging over more than one input signal event, and in the case of repetitive signals, by statistically averaging over several measurements.

For frequency measurement of pulsed signals, for example the RF bursts in a pulsed radar signal, the measurement must be started and stopped while the pulsed signal is present for the frequency measurement to be correct. Otherwise, the time counter is accumulating clock events when the event counter has no corresponding input signal events to accumulate.

Conventional counters assured that the gate signal was opened and closed within the duration of the pulsed input signal by using the envelope of the pulsed input signal to generate the gate signal. This technique involves the use of expensive delay lines, and results in some uncertainty of the timing relationship of the gate to the input pulse.

FIG. 1 shows an example of the wave forms in the conventional technique. Wave form A is the pulse envelope, wave form B is the RF pulse, delayed by 15 nsec using a delay line to preserve the signal. Wave form C is the envelope delayed by 30 nsec. Wave form D is the gate, produced by combining wave forms A and C in a logical AND gate. The result is a gate signal D that opens 15 nsec after the start of the pulse and closes 15 nsec. before the end of the pulse.

In addition to the average frequency of the pulsed signal, it may be desirable to measure the behavior of the input signal frequency over time, the "frequency profile". This kind of measurement is important for transient or swept frequencies, e.g., chirped radar pulses. This measurement is conventionally made by using a narrow gate from an external pulse generator that is "swept through" the input signal pulse in a series of measurements.

A major drawback of this method is that narrowing the gate reduces the accuracy of the frequency measurement, while widening the gate smooths out the possible frequency variations over time, and thus reduces the ability to measure rapid frequency variations in the input signal. A narrow gate reduces the frequency accuracy in two ways: random and systematic errors. In the first case, random truncation error in the time measurement becomes a more significant fraction of the gate, thereby increasing random fractional frequency error. In the second case, systematic errors from start to stop of the gate tend to react with each other more with proximity, making calibration by simple subtraction of fixed errors less accurate.

Another drawback is that because of the delays in generating the external gate pulses, it is difficult to open the gate near the leading edge of a pulse. The gate can be delayed to the next pulse, but jitter in the timing of the delay generator or in the pulse repetition interval lead to uncertainty in the position of the gate with respect to the pulse.

SUMMARY OF THE INVENTION

The invention is a method of digitally controlling the gate for a timing counter, to open and close the gate based on the occurrence of signal events, rather than on the envelope of the pulse. In a particular embodiment, a digital divider controls the gate, so that, when a pulse burst of RF is encountered, the gate opens on the second signal event. The divider can be programmed to close the gate any number of signal events later. Measurements are taken for an integral number of signal events, while counting time events from a precision clock. A series of measurements can be taken with various integral numbers of signal events for frequency profiling.

By incrementing the digital divider from n to n+1 signal events for successive measurements, and subtracting the results, very narrow gates are effectively generated which move through the pulse cycle by cycle for frequency profiling. The actual gates used, however, are much wider, reducing the effect of random and systematic errors. Because the opening of the gate is triggered by the IF events themselves, the gate is reliably and accurately positioned with respect to the pulse, and is unaffected by jitter in the pulse repetition interval.

The preferred embodiment is particularly applicable to generation of measurement gates for a frequency counter for pulsed microwave signals, or signals with transient or variable frequency.

DETAILED DESCRIPTION OF THE INVENTION

Figure 1:
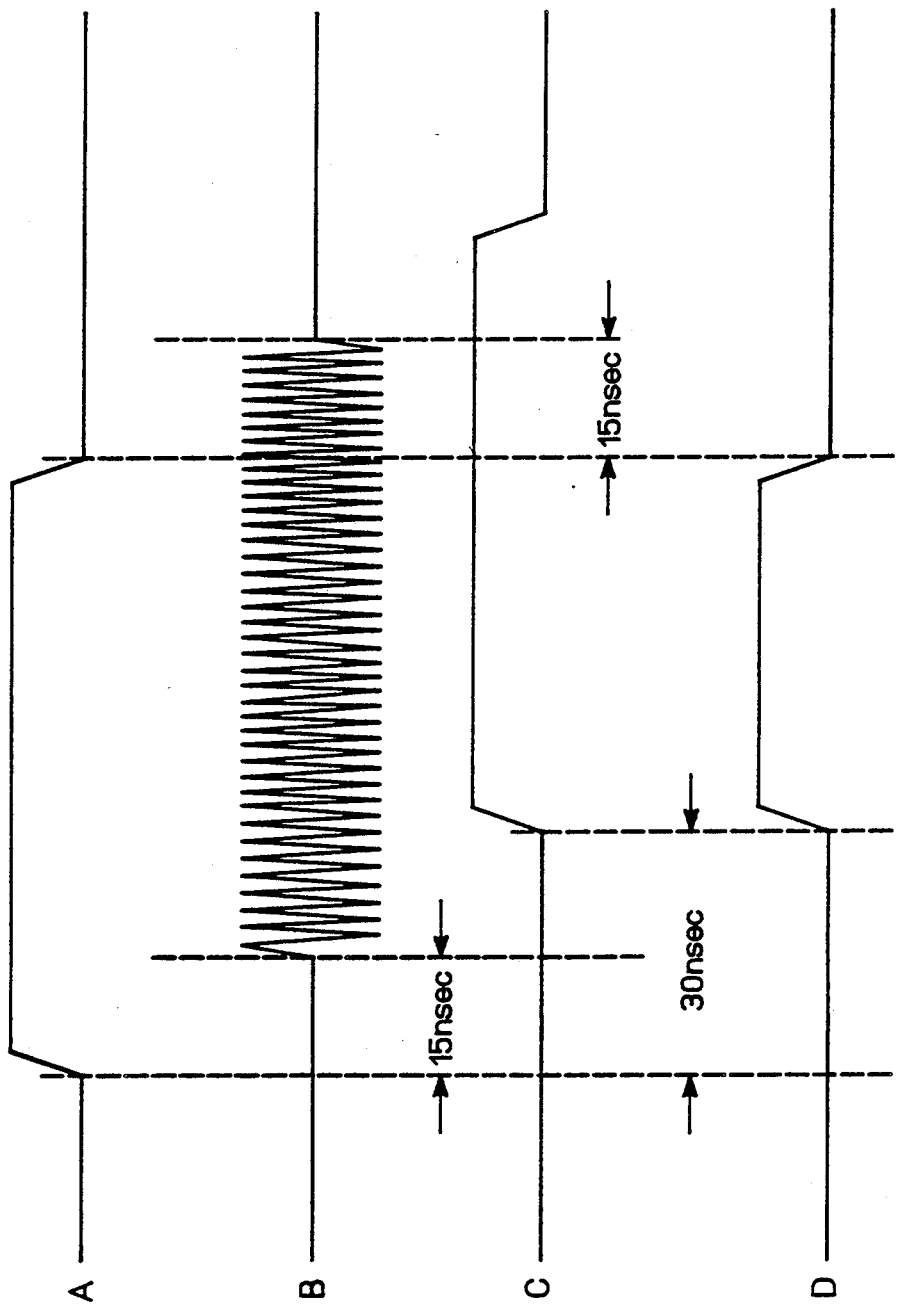
FIG. 1 shows wave forms from a conventional gate generator circuit.
Figure 2:
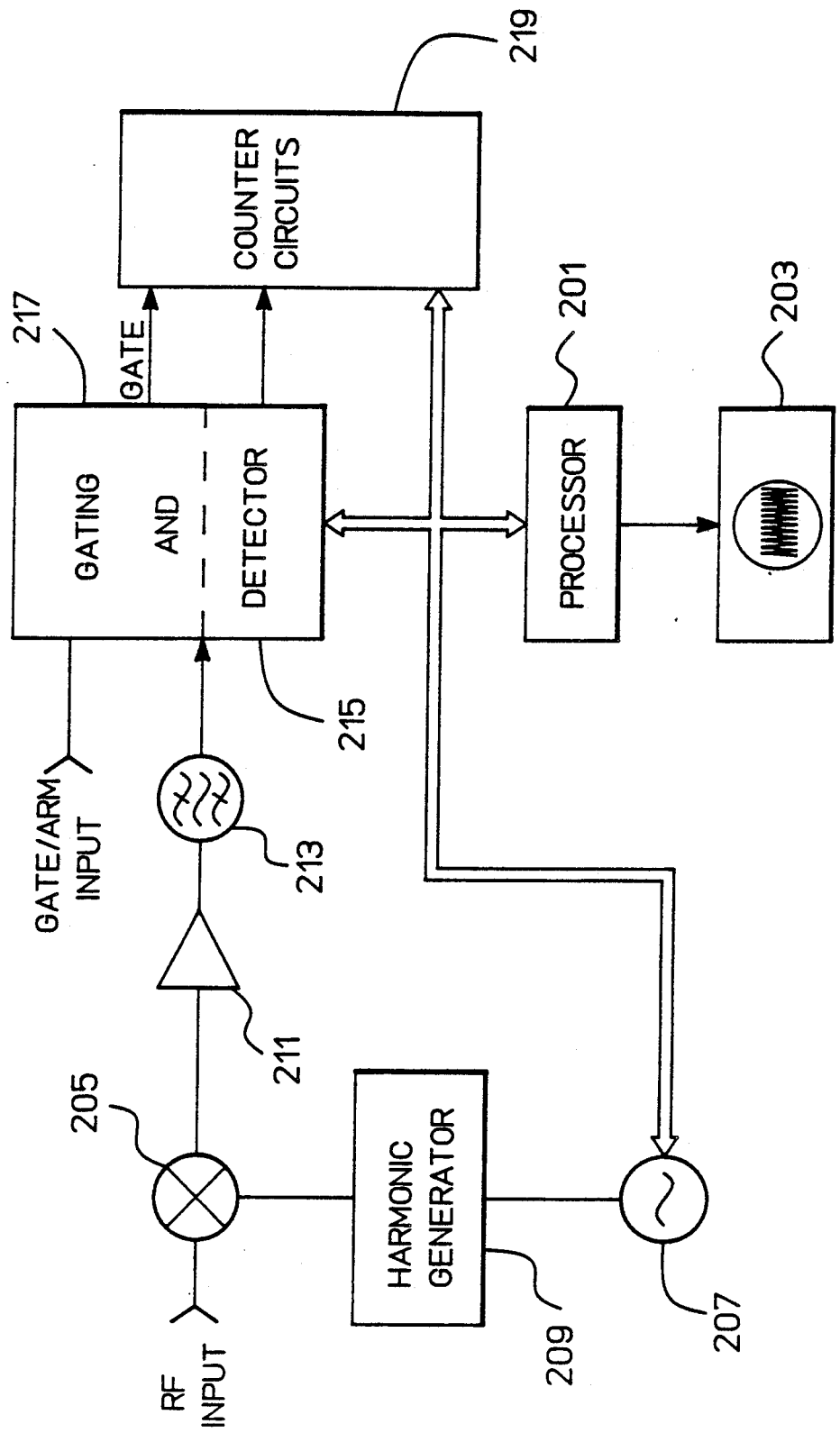
FIG. 2 shows a simplified high level block diagram of a microwave counter incorporating the gating technique of the invention.

FIG. 2 shows a simplified high level block diagram of a microwave counter incorporating the gating technique of the invention. The counter operates under control of microprocessor 201, with the results of the measurements shown on display 203. A high frequency input signal, for example a microwave signal, is down converted by harmonic heterodyne conversion in mixer 205. Other methods for down conversion could also be used, for example direct mixing of harmonic mixing. A local oscillator 207 generates an LO signal whose harmonics, produced by a harmonic generator 209, are mixed with the input signal to produce an intermediate frequency (IF) signal, at a frequency the counter circuits can process. The IF signal passes through amplifier 211 and filter 213, then is applied to the detection circuit 215 and the gating circuit 217. The detection circuit 215 determines if an input signal is present and whether the signal is pulsed or CW. The gating circuit 217, described in more detail below, digitally generates the gate signal for the event and time counter circuits 219, which accumulate the count data on which the measurement is based. A gate/arm selection input, selected by the operator, determines the mode of operation of the gating circuit 217.

GATE GENERATION CIRCUIT

Figure 3:
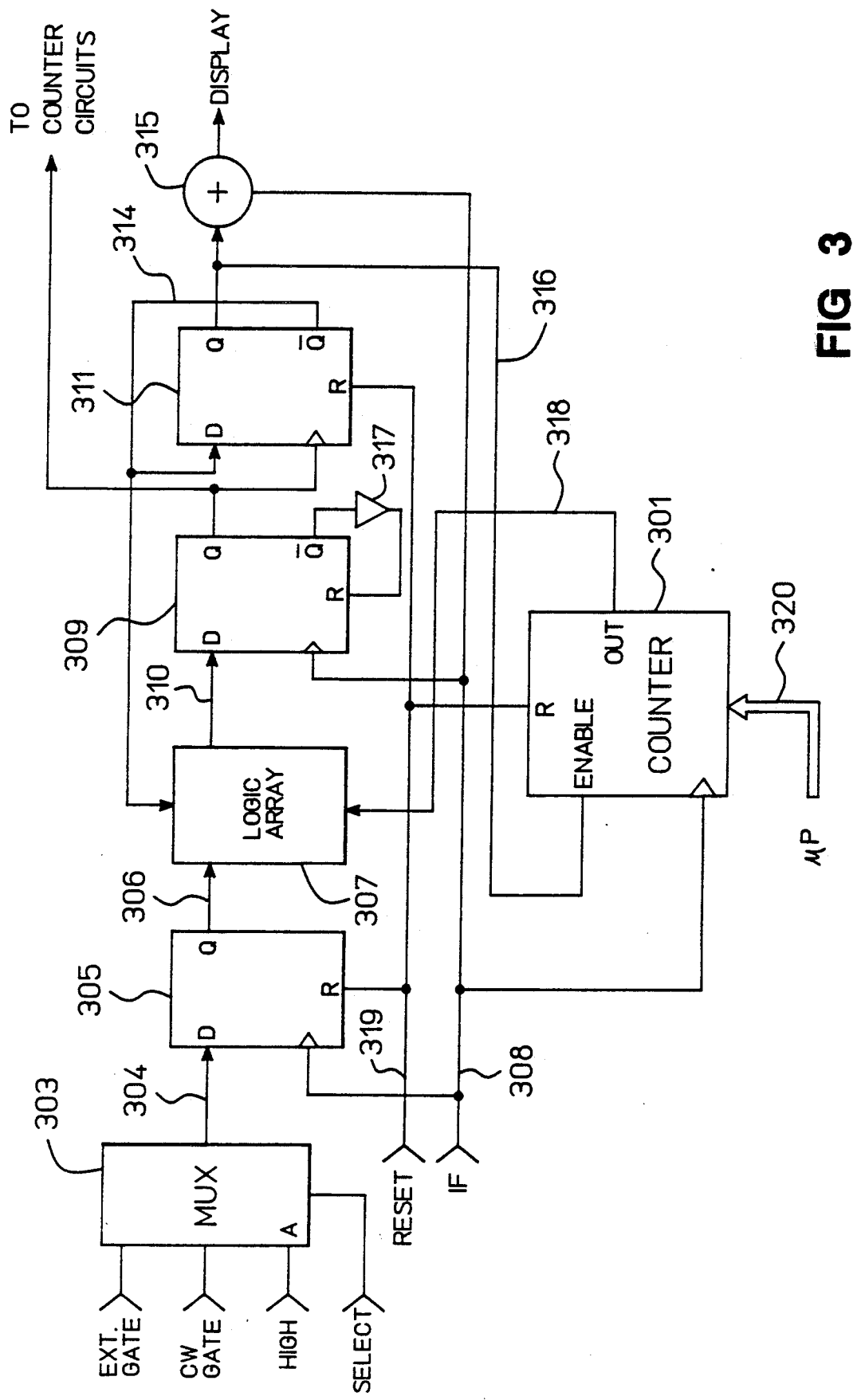
FIG. 3 shows a schematic block diagram of a gate generation circuit which embodies the teachings of the invention.

FIG. 3 shows a more detailed schematic block diagram of the gating circuit 217 shown in FIG. 2. A programmable digital counter 301 counts IF events, and produces a signal to close the gate at the appropriate time. A multiplexer 303 selects the gate arming mode. Flip flop 305 synchronizes the gating operation to the IF events, logic element 307 provides control logic, gate flip flop 309 produces pulses to control the event and time counters 219, and flip flop 311 produces an event gate signal for enabling the programmable counter 301. The programmable counter and the flip flops are reset prior to the beginning of each measurement cycle.

Multiplexer 303 selects one of three input signals as an arming signal for the gate generation logic, under control of a selection signal from the microprocessor 201, based on the mode selected by the operator. The external gate and CW gate input signals arm both the opening and closing of the gate. The internal gate input is a constant high level logic input. The output of multiplexer on line 304 is applied to the D input of synchronizing flip flop 305.

Flip flop 305 synchronizes the arm signal to the IF signal. The IF signal on line 308 is applied to the clock input of flip flop 305. The Q output of flip flop 305, called "Synch-Arm", will go high on the next IF event after the arm signal goes high. This synchronizes the gate generation to the IF signal, an important timing consideration. Synchronization introduces a delay of one IF event. The Synch-Arm signal on line 306 is applied to logic array 307.

Logic array 307 receives the Synch-Arm signal from flip flop 305, the inverted Event Gate signal from flip flop 311, and the Gate Close signal from programmable counter 301 on line 318. Logic array 307 may be implemented, for example as a programmable logic array, or as discrete logic circuit elements. Logic array 307 is arranged so that its output goes high when the Synch-Arm input goes high, goes low when the Event Gate signal goes high, and is held low from the time the Event Gate signal goes high until the occurrence of the Gate Close signal. The output of logic array 307 is the "Gate Control" signal on line 310.

Flip flop 309 produces the pulses, called the "Time Gate", that actually start and stop the counters in counter circuits 219 that perform the measurement. The Gate Control signal on line 310 is applied to the D input of flip flop 309, and the IF signal on line 308 is applied to the clock input of flip flop 309. The inverted output of flip flop 309 is connected through an invertor 317 to the reset input of flip flop 309, so the flip flop operates in a one-shot mode to produce a short pulse when its output changes state. Thus, on the next IF event after the gate control signal on line 310 goes high, flip flop 309 will produce a narrow pulse on its Q output. This happens at the open and close of the gate. Because the IF signal is used as the clock, another IF event delay is introduced, so the first Time Gate pulse occurs on the second IF event after the arm signal goes high.

Flip flop 311 produces the "Event Gate" signal that is high for the duration of the measurement gate. The inverted output of flip flop 311 is connected to the D input of flip flop 311 on line 314, so the flip flop operates as a toggle on clock inputs. Flip flop 311 is clocked by the Time Gate pulses on line 312. The Q output of flip flop goes high on the start Time Gate pulse, and toggles to low on the Time Gate stop pulse, creating the Event Gate signal that is high for the duration of the measurement gate. The Event Gate signal is applied to the programmable counter 301 as an enable input on line 316, and also summed with the IF signal at sum node 315. The inverted output of flip flop 311 is applied as an input to logic array 307 on line 314.

Programmable counter 301 controls the duration of the measurement gate by counting a preset number of IF events after the gate opens, then producing a "Close Gate" signal. The programmable counter 301 is set by signals received from microprocessor 201 via data and control bus 320. The IF signal on line 308 is applied to the clock input of the counter 301, and the Event Gate signal is applied to the enable input of the counter 301. The counter starts counting IF events when the Event Gate input goes high, and produces the Close Gate signal when the count reaches the preset number. The Close Gate signal is applied to logic array 307, changing the Gate Control signal so flip flop 309 produces the Time Gate close pulse at the next IF event. Thus, there is a delay of one IF event between the Close Gate signal and the Time Gate close pulse that actually ends the measurement. Because of this, the counter 301 is programmed to count one IF event less than the desired measurement gate duration.

MEASURING AVERAGE FREQUENCY IN A PULSE

Figure 4:
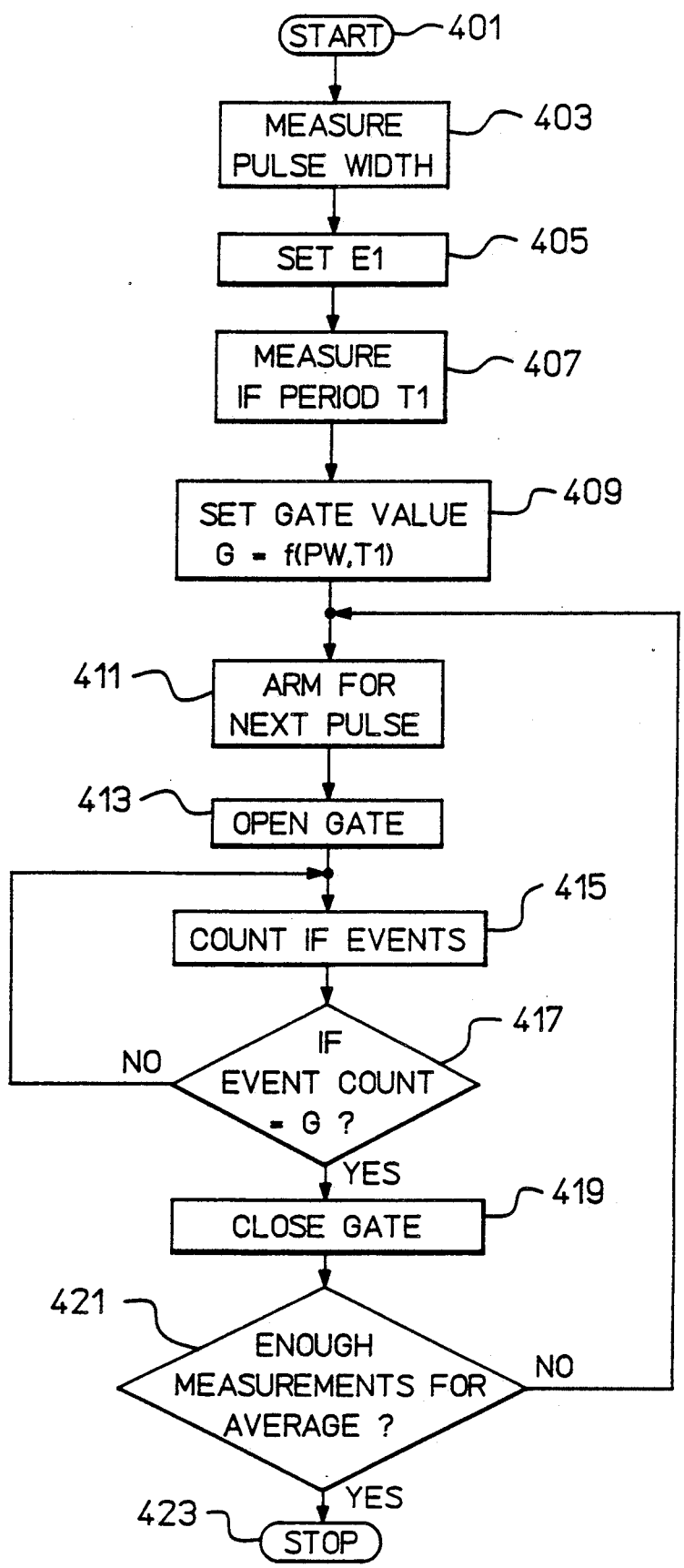
FIG. 4 is a flow chart of the process of gate generation for average frequency in a pulse.

The flow chart of FIG. 4 illustrates the operation of the microprocessor in controlling the counter to perform a measurement of the average frequency in a repetitive pulsed RF signal. From start block 401, the counter measures the pulse width PW of the input signal at block 403.

Without knowledge of the input signal frequency, or the corresponding IF frequency, the gate must be set so the IF frequency can be measured. Based on the measured pulse width and the minimum IF frequency, an estimated gate value E1 (the number of IF events the gate remains open) is determined at block 405, to be certain the gate duration is shorter than the pulse duration for any IF frequency. For example, for a pulse width of 1 microsecond and a minimum IF frequency of 45 MHz, a suitable gate value would be 45 IF events.

With the gate value set to the E1, at block 407 the counter makes an estimated measurement of the IF frequency F1 and period T1 by measuring the time for E1 events. From the pulse width PW and the IF period T1, the gate value G is determined at block 409, setting G so that the gate will cover most of the pulse width, but closes before the end of the pulse. The inventors have found that good results are obtained by setting the gate according to the formula:

$$G = PW(E1/T1)(\tfrac{7}{8}) - 4$$

Considering that the gate opens on the second IF event in the pulse, this gate value provides a gate that is open for about $\tfrac{7}{8}$ of the pulse width, starting two IF cycles into the pulse. This gate value is empirically derived to allow for pulse width jitter frequency modulation on the input signal, and other factors that affect the number of IF events in a pulse. Other formulas that take these factors into account could also be used to set the gate value.

With the gate value set, the counter arms the gate generating circuit for the next pulse at block 411, and opens the gate at the beginning of the pulse at block 413, and begins to count IF events at block 415. When the number of IF events reaches the gate value G, the decision block 417 closes the gate at block 419. The counter determines whether enough measurements have been taken to produce an average with sufficient resolution at decision block 421. If more measurements must be taken, the process returns to the arming block 411, otherwise, the measurement stops at block 423.

Figure 5:
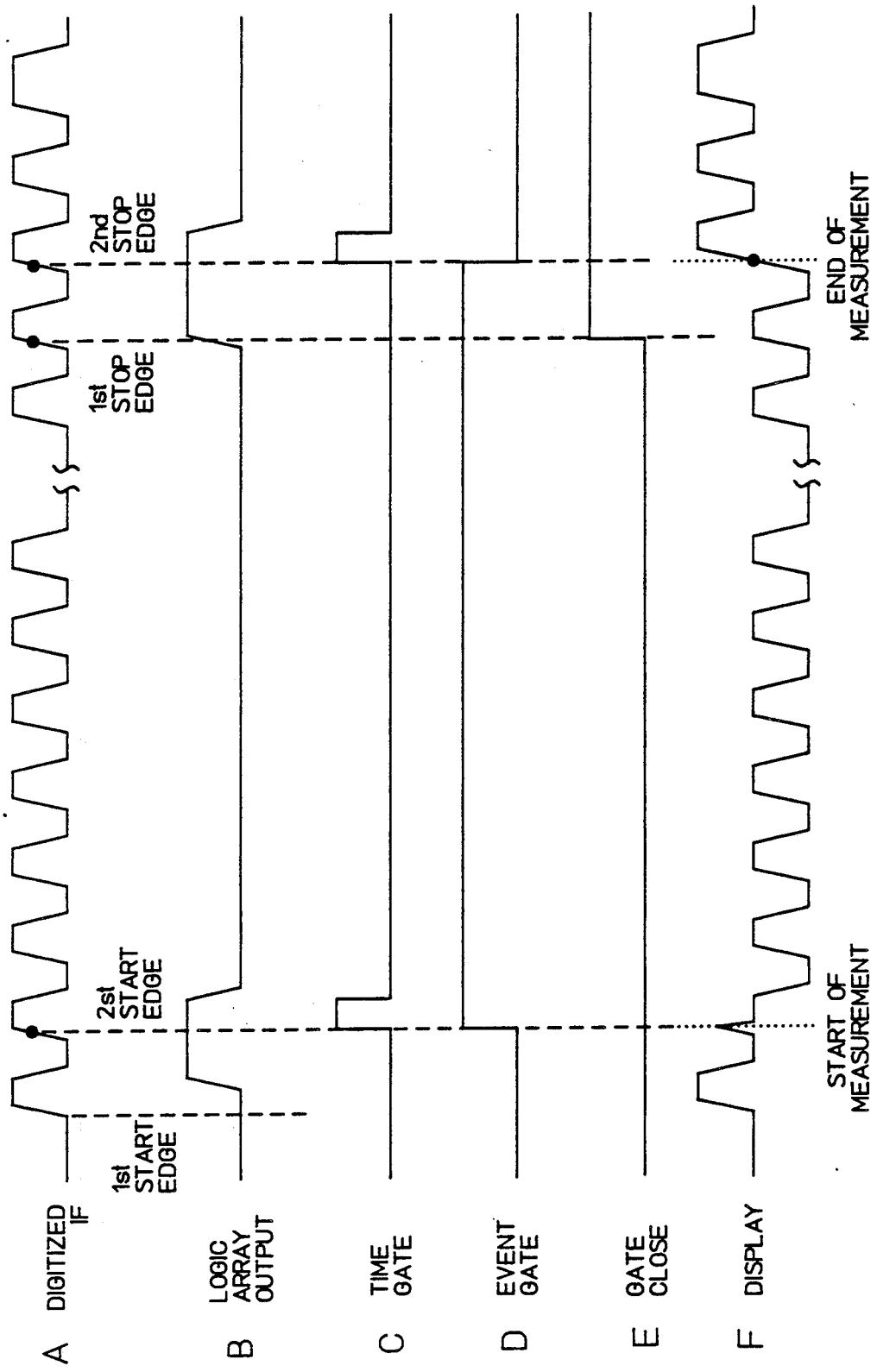
FIG. 5 shows the pulse wave forms from the gate generation circuit of FIG. 3 for measuring average frequency.

The wave form diagrams in FIG. 5 illustrate the timing relationship of the pulsed input signal and the gate signal produced according to the process of FIG. 4. Wave form A shows the digitized IF signal, appearing on line 308, that clocks the programmable counter 301 and flip flops 305 and 309. Wave form B shows the output signal from logic array 307 to enable flip flop 309 for the first Time Gate pulse, then to disable flip flop 309 until the gate close signal, and then to enable flip flop 309 again for the second Time Gate pulse. Wave form C shows the Time Gate signal from flip flop 309, that controls the start and stop of the event and time counter circuits 219. Wave form D shows the Event Gate signal from flip flop 311, that enables the programmable counter 301. Wave form E shows the Gate Close output signal from counter 301, that is sent to logic array 307 to close the measurement gate on the next IF event. The Event Gate signal is also summed with the IF signal to create an output wave form F, showing the exact timing relationship of the measurement gate to the pulsed input signal.

MEASURING FREQUENCY PROFILE IN A PULSE

The counter of the invention can make frequency profile measurements without an external delay generator or external pulse generator because of the digital gate generation capability of the counter. The counter makes a series of measurements, with the gate width incremented by one or more IF events for each succeeding measurement. The IF frequency profile is most simply obtained by subtracting successive time measurements, then dividing the incremental number of IF events between successive measurements by the corresponding time measurement difference. If the gate is incremented by one IF event for each measurement, a cycle by cycle profile of the signal can be obtained.

The profile data produced can be stored for subsequent processing and analysis. For example, by subtracting both events and time between neighboring measurements in addition to adjacent measurements and by dividing a weighted sum of such event differences by an equivalently weighted sum of the time differences, filtered versions of the frequency profile can be generated.

The profiling can extend to the maximum gate width. An additional benefit of this profiling procedure is that the maximum gate width need not be known in advance. As the number of IF events in the gate width is made larger and extends beyond the end of the pulse, the resulting corruption of data will not affect the profile results within the pulse. The corrupted data can be discarded, keeping only the correct portion of the measurement.

As in the average frequency measurement example, the counter measures the pulse width and the IF frequency. The maximum gate value G is determined and stored for limiting the profiling measurement. The gate value is initially set to a small number, for example 4, a measurement is taken and the result stored. The gate value is incremented, another measurement is taken, and that result is stored. The gate value is incremented and additional measurements are taken and stored until the gate value is equal to G, the maximum value for the pulse width and the profiling measurement set is completed.

Figure 6:
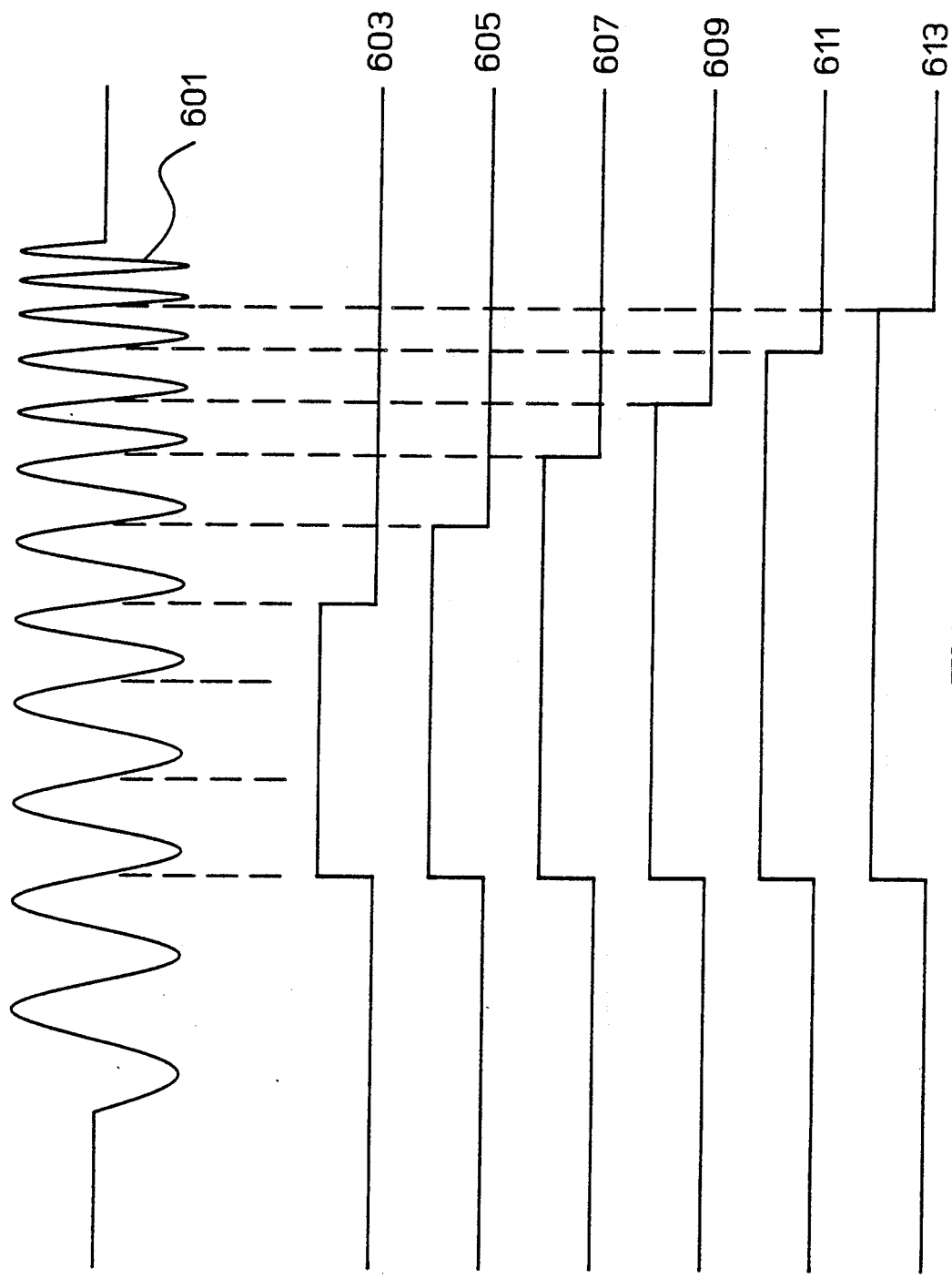
FIG. 6 shows the pulse wave form with the frequency profiling gates generated by the invention.

FIG. 6 shows an example of a variable frequency pulsed signal 601 and the succession of gates 603, 605, 607, 609, 611 and 613 generated to profile the signal. In the example shown in FIG. 6, the initial gate value is 3 for gate 603, and the incremental value is 1. Thus, for the longest gate, 613, the sixth in the series, the gate value is 8. For simplicity, this example shows a very short pulse, and most profiling measurements will include many more iterations.

A more typical example of an input signal would be a 1 microsecond pulse of IF at 50 MHz, giving 50 IF events per pulse. Starting with a gate value of 3 and incrementing by 1, a profiling measurement set would take 37 measurements, with the last gate value equal to 39 (i.e., $50(\tfrac{7}{8}) - 4$).

For much larger pulse widths, the initial gate value and the incremental increase can be set appropriately larger, to yield a reasonable number of measurements in the profiling set.

Because all the gates are opened on the second IF event in the pulse, any systematic errors between the measurements tend to cancel. The effect is to produce data resolution equivalent the that of a narrow gate, with improved accuracy because the number of events and time period being measured is much larger.

Another application of profiling is measuring frequency transients, for example a VCO step response. The external gate mode of the counter can be used, with the step voltage change applied to the VCO arming the gate generation circuit.

DIGITAL GATE DELAY

Figure 7:
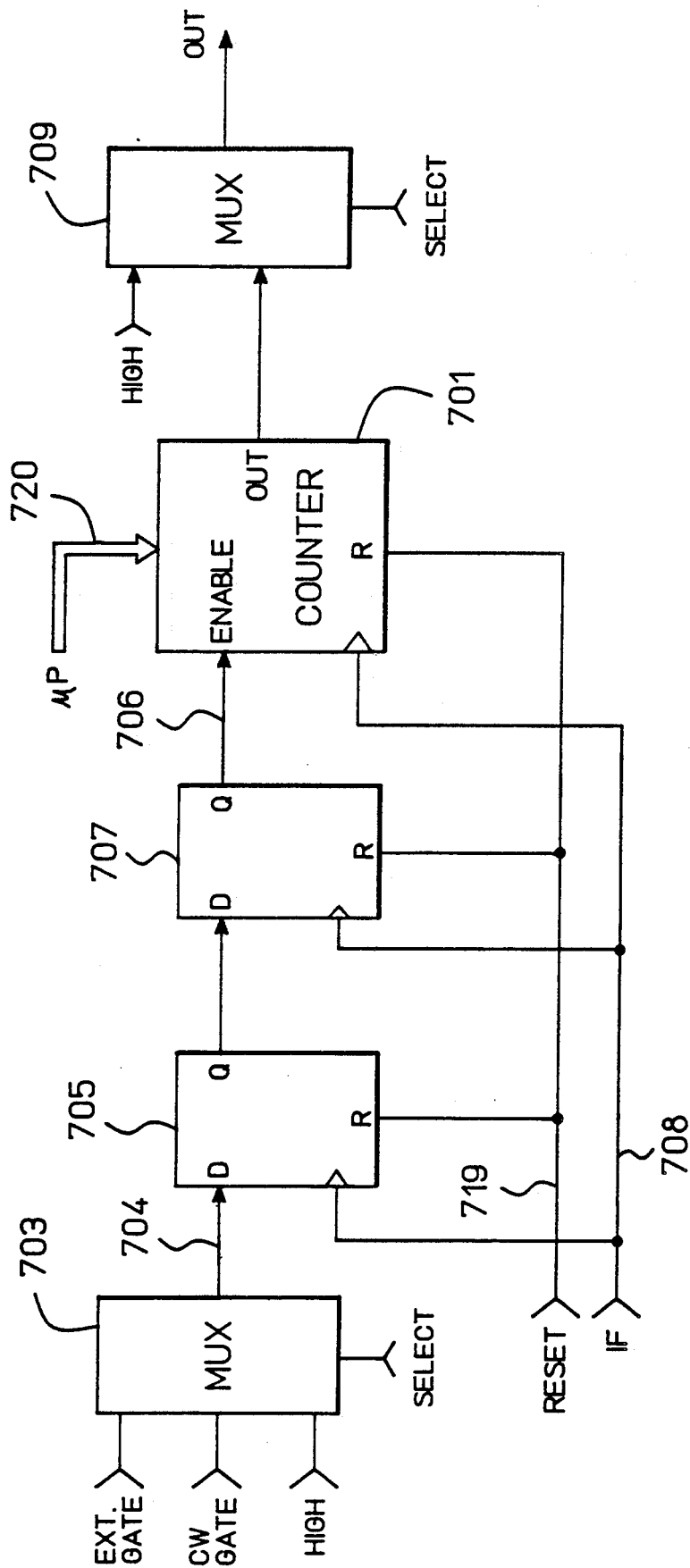
FIG. 7 is a schematic block diagram of an circuit for adding a programmable delay to the opening time of the gate generated by the FIG. 3 embodiment.

For some measurements, it may be desirable to delay the opening of the gate. FIG. 7 is a schematic block diagram of an circuit for adding a programmable delay to the opening time of the gate generated by the FIG. 3 embodiment. The output of the circuit shown in FIG. 7 is applied to the input A of multiplexer 303 shown on FIG. 3. The delay circuit of FIG. 3 has a programmable counter 701 that counts a preset number of IF signal events before producing a logic high output signal applied to the gate generation circuit of FIG. 3 to open the measurement gate. A multiplexer 703 selects the gate arming mode. Flip flops 705 and 707 synchronize the gating operation to the IF events, and produce a signal for enabling the programmable counter 301. The programmable counter and the flip flops are reset prior to the beginning of each measurement cycle.

Multiplexer 703 selects one of three input signals as an arming signal under control of a selection signal from the microprocessor 201, based on the mode selected by the operator. The external gate, CW gate, and internal gate inputs are the same as for multiplexer 303 in FIG. 3. The output of multiplexer 703 on line 704 is applied to the D input of synchronizing flip flop 705.

Flip flops 705 and 707 are connected in series to synchronize the arm signal to the IF signal. The IF signal on line 708 is applied to the clock inputs of flip flops 705 and 707. The Q output of flip flop 705 is connected to the D input of flip flop 707, and the Q output of flip flop 707 has the same wave form as the Synch-Arm signal from flip flop 305, and synchronizes the gate delay to the IF signal. Synchronization introduces a delay of two IF events. The delay Synch-Arm signal on line 706 is applied to the enable input of delay programmable counter 701.

Programmable counter 701 controls the duration of the delay in opening the measurement gate by counting a preset number of IF events, then producing an arming signal for the gate generation circuit in FIG. 3. The programmable counter 701 is set by signals received from microprocessor 201 via data and control bus 720. The IF signal on line 708 is applied to the clock input of the counter 701, and the delay Synch-Arm signal is applied to the enable input of the counter 701. The counter starts counting IF events when the delay Synch-Arm signal goes high, and produces the "Delay Arm" signal on line 710 when the count reaches the preset number. The arming signal is applied to output multiplexer 707. Multiplexer 707 selects either the Delay Arm signal or a logic high input as the arming signal applied to the A input of multiplexer 303, under control of a selection signal from the microprocessor 201, based on the mode selected by the operator. The Delay Arm input is selected if the user has chosen the RF gate delay mode. The logic high input is selected if the user does not select the gate delay mode. This is equivalent to disabling the delay circuit of FIG. 7, with a logic high input applied to the A input of multiplexer 303.

The two IF event delay introduced by the delay circuit is added to the two IF event delay in the gate generation circuit of FIG. 3. Because of this, the counter 701 is programmed to count four IF events less than the desired measurement gate delay.

CW GATING MODE OPERATION

If the CW gating mode is selected, multiplexer 303 applies the CW gate input signal to line 304, for arming flip flop 305. This CW gate signal is internally generated and is logic high for the duration of the CW measurement.

Two IF events after the arm signal goes high, flip flop 309 produces the first Time Gate pulse, as described above for internal gating operation.

In CW gating mode, the Time Gate and Event Gate can be terminated by the CW gate signal or at a preset count in the programmable counter 301. Terminating at a preset count proceeds as described for internal gating, with the programmable counter 301 generating a close gate signal on line 318 after a predetermined number of IF pulses have appeared on line 308.

However, particularly for a chirped or other frequency varying signal, it may be preferred to control the gate closing with the CW gate signal. If so, the Close Gate output of programmable counter is disabled by, for example, a control signal from processor 201 on bus 320. The measurement continues until the CW gate signal goes low, and the programmable counter counts the number of IF events during the duration of the CW gate. Two IF events after the CW gate signal goes low, flip flop 309 generates the second Time Gate pulse to stop counter circuits 219, and flip flop 311 closes the Event Gate disabling the programmable counter.

If the gate is opened and closed under control of the CW gate signal, the measured frequency is the number of if events counted by the programmable counter 301 divided by the time measured by counting circuits 219.

EXTERNAL GATING MODE OPERATION

If the external gating mode is selected, multiplexer 303 applies the external gate input signal to line 304, for arming flip flop 305. This external gate signal is a user supplied signal, that is logic high for the duration of the desired measurement.

As for the CW gate signal, when the external gate signal goes high, circuit by produces the first Time Gate pulse to start the counting circuits 219 and opens the Event Gate to start the programmable counter 301. Similarly, when the external gate signal 18 goes low, the circuit produces the second Time Gate pulse to stop the counting circuits 219 and closes the Event Gate to stop the programmable counter 301.

The measured frequency for external gating mode is the number of if events counted by the programmable counter 301 divided by the time measured by counting circuits 219.

A circuit and method are thus provided which generate the desired measurement gate for measuring a selected electrical signal, capable of profiling the frequency of the signal.

While for the preferred embodiment IF pulses have been utilized for clocking and for the display, it is apparent that the invention could be practiced using the RF pulses of the microwave signal, and that with suitable modification analog signals might be usable on line 308. Further, while specific hardware components are shown in FIG. 3 for implementing the invention, such components are not a limitation on the invention and the invention may be practiced utilizing other suitable hardware, a programmed processor or a combination of hardware and software. Thus, while the invention has been shown and described with respect to a preferred embodiment the foregoing and other changes in form and detail may be made therein by one skilled in the art without departing from the spirit and scope of the invention.

We claim:

1. A circuit for providing a series of measurement gates relative to a repetitive input signal being measured, for performing a series of measurements to profile the frequency of the input signal, comprising:

logic means for providing an arming signal for arming the circuit to make a measurement;

means for generating a gate start signal in response the arming signal and to a signal indicative of the input signal being measured, the gate start signal synchronized to a selected event of the indicative signal;

means for generating a gate close signal in response to a signal indicative of the input signal being measured, a programmable integral number of indicative signal events after the gate start signal; and means for sequentially incrementing the integral number after a measurement and signaling the arming means to provide an arming signal for performing another measurement.

2. The circuit of claim 1 wherein the input signal being measured is a microwave signal, and the indicative signal is an IF signal to which the microwave signal has been down converted for measurement.

3. The circuit of claim 1 wherein the input signal being measured is a pulsed microwave signal, and the indicative signal is a pulsed IF signal to which the microwave signal has been down converted for measurement.

4. The circuit of claim 3 wherein the gate start signal generating means generates the gate start signal synchronized to the second event in a pulse of the indicative signal.

5. The circuit of claim 1 wherein the integral number is incremented by 1 after a measurement, so that for each sequential measurement the gate is open one event longer than for the preceding measurement.

6. The circuit of claim 1 comprising:
means for delaying the arming signal for a programmable number of indicative signal events.

7. A circuit for providing a measurement gate relative to an input signal being measured, comprising:

logic means for providing an arming signal for arming the circuit to make a measurement, the arming signal delayed for a programmable number of indicative signal events;

means for generating a gate start signal in response the arming signal and to a signal indicative of the input signal being measured, the gate start signal synchronized to an event of the indicative signal; and means for generating a gate close signal in response to a signal indicative of the input signal being measured, an integral number n of indicative signal events after the gate start signal.

8. A circuit for providing a measurement gate relative to a pulsed input signal being measured, comprising:

means for producing a gate start signal in response to a signal indicative of the input signal being measured, the gate start signal synchronized to an event of the indicative signal and produced a predetermined number of indicative signal events after the start of the pulse;

means for measuring the pulse width of the input signal and means for measuring the period of the indicative signal events;

means for counting indicative signal events and producing an output signal an integral number of indicative signal events after the gate start signal, the number determined as a function of the pulse width of the input signal and the period of the indicative signal events;

means for producing a gate close signal in response to the output signal from the counting means.

9. The circuit of claim 8, wherein the gate duration G is determined according to the expression:

$$G = PW(E1/T1)(\tfrac{3}{4}) - 4$$

where PW is the pulse width, and E1/T1 is the period of the indicative signal events.

10. The circuit of claim 8 further comprising:
means for delaying the gate start signal for a programmable number of indicative signal events from the beginning of the pulse.

* * * * *